United States Patent
Mano et al.

(10) Patent No.: US 6,976,616 B2
(45) Date of Patent: Dec. 20, 2005

(54) CIRCUIT BOARD TRANSFERRING APPARATUS AND METHOD AND SOLDER BALL MOUNTING METHOD

(75) Inventors: Akihiro Mano, Niigata (JP); Yukihiro Ueno, Niigata (JP); Hironori Urasawa, Niigata (JP); Akihiro Tanaka, Niigata (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 10/710,886

(22) Filed: Aug. 10, 2004

(65) Prior Publication Data

US 2005/0035182 A1 Feb. 17, 2005

(30) Foreign Application Priority Data

Aug. 11, 2003 (JP) .............................. 2003-291769

(51) Int. Cl.⁷ ........................ B23K 37/04; B23K 37/00
(52) U.S. Cl. ..................................... 228/49.5; 228/47.1
(58) Field of Search ................................ 228/20.1, 103, 228/108.21, 180.22, 246, 41, 47.1, 49.5

(56) References Cited

U.S. PATENT DOCUMENTS

| | | | | |
|---|---|---|---|---|
| 5,831,247 A | * | 11/1998 | Hidaka | 219/388 |
| 5,926,278 A | * | 7/1999 | Asai | 356/613 |
| 6,170,737 B1 | * | 1/2001 | Foulke et al. | 228/245 |
| 6,789,720 B2 | * | 9/2004 | Uchida et al. | 228/22 |
| 6,926,188 B2 | * | 8/2005 | Hazeyama et al. | 228/41 |

FOREIGN PATENT DOCUMENTS

| | | |
|---|---|---|
| JP | 08-236918 | 9/1996 |
| JP | 10-189868 | 7/1998 |
| JP | 11-138257 | 5/1999 |
| JP | 2001-110933 | 4/2001 |

* cited by examiner

*Primary Examiner*—Lynne R. Edmondson
(74) *Attorney, Agent, or Firm*—Connolly Bove Lodge & Hutz LLP; Larry J. Hume

(57) ABSTRACT

By photographing pad forming faces of CSPs 400 to recognize a pad arrangement through image processing so as to transfer and position the CSPs 400 in accordance with the recognition result of the pad arrangement, even if pads 401 are formed in any arrangement state in the CSPs 400 to be transferred, the positional relation between the pads 401 included in the CSPs 400 is made to always accurately coincide with the positional region between a plurality of solder ball attracting nozzles of a solder ball mounting apparatus.

3 Claims, 4 Drawing Sheets

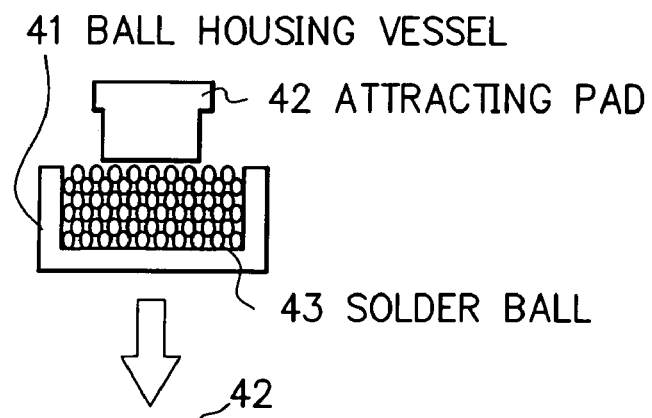
F I G. 4A
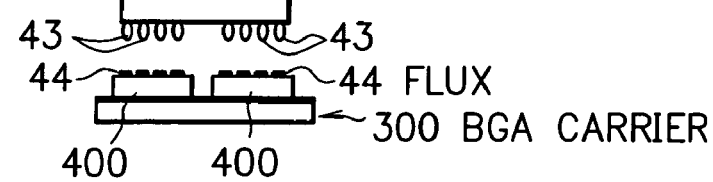
F I G. 4B
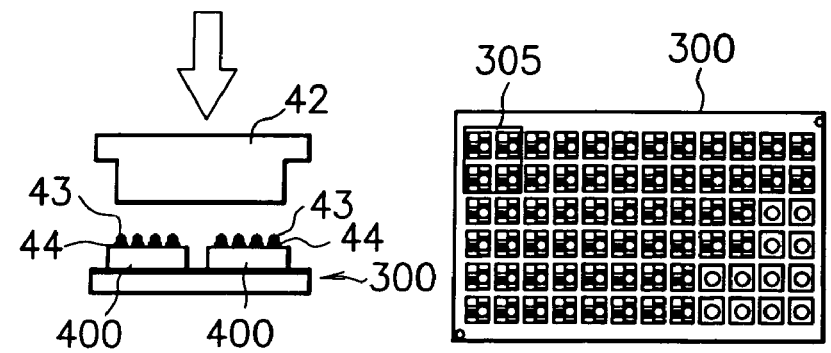
F I G. 4C

CIRCUIT BOARD TRANSFERRING APPARATUS AND METHOD AND SOLDER BALL MOUNTING METHOD

BACKGROUND OF THE INVENTION

1. Field of the Invention

The present invention relates to circuit board transferring apparatus and method and a solder ball mounting method, for example, an apparatus for arranging a circuit board of a plurality of BGA semiconductor packages before solder balls are mounted on a tray and transferring it and a method for mounting solder balls on the circuit board of the BGA semiconductor packages transferred on the tray.

2. Description of the Related Art

Because of requests for advancement in functions and decrease in size and weight of an electronic unit in recent years, an internal circuit of a semiconductor package used for an electronic unit becomes complex and the number of signals to be transferred to and from an external unit is increased. Thereby, decrease in size and increase in the number of pins of a semiconductor package are progressed. As a high-density mounting technique corresponding to decrease in size and increase in the number of pins of a semiconductor package, a technique referred to as BGA (Ball Grid Array) or CSP (Chip Size Package) is used these days.

The BGA is a surface mounting component using solder balls as pins, which makes it possible to decrease a pin pitch compared to a conventional inserting component which is soldered by inserting a lead frame into a hole opened in a substrate. The CSP is a very small LSI making it possible to make the size of a semiconductor package almost equal to the size of a semiconductor chip in the package by further decreasing an pin pitch, which is one type of the BGA.

A plurality of pads are formed like a grid array for mounting solder balls on the outside of a BGA board. To mount solder balls on the BGA board, an adhesive flux is applied onto the pads, the solder balls are transferred from a ball housing vessel onto the pads to temporarily fix the solder balls on the pads by the adhesion of the flux. Thereafter, the solder balls are welded to the pads by adding heat treatment (reflow).

Solder ball transferring apparatuses have been provided so far which respectively make it possible to transfer a plurality of solder balls onto pads at the same time (for example, refer to Patent Documents 1 to 4). [Patent Document 1] Japanese Patent Laid-Open No. 8-236916; [Patent Document 2] Japanese Patent Laid-Open No. 10-189666; [Patent Document 3] Japanese Patent Laid-Open No. 11-138257; [Patent Document 4] Japanese Patent Laid-Open No. 2001-110933.

This type of the solder ball transferring apparatuses is constituted by including a ball housing vessel for housing solder balls and a ball carrier for transferring the solder balls onto pads of a BGA board from the ball housing vessel. The ball carrier has a plurality of solder ball attracting nozzles arranged on the same array as the pad array on the BGA board. The solder ball transferring apparatus thus constituted operates as described below.

Firstly, the apparatus vacuum-attracts and picks up a plurality of solder balls housed in the ball housing vessel by using solder ball attracting nozzles of the ball carrier. In this case, one nozzle vacuum-attracts one solder ball. Therefore, by carrying attracted and held solder balls onto pads and canceling the vacuum-attraction state, a plurality of solder balls are transferred onto a plurality of pads at the same time.

Thus, when transferring a plurality of solder balls onto pads at the same time, it is necessary to make the array of a plurality of pads formed on a circuit board (e.g. BGA board) accurately coincide with the array of a plurality of solder ball attracting nozzles set to a ball carrier. Recently, an apparatus is proposed which arrays a plurality of circuit boards and simultaneously mounts solder balls on a plurality of pads present on the circuit boards. In this case, it is requested that alignment of arrays is performed at higher accuracy.

That is, when arranging a plurality of circuit boards, it is necessary to make the positional relation between all pads included in the circuit boards accurately coincide with the positional relation between a plurality of solder ball attracting nozzles. FIG. 5 is a drawing to show the outline of a conventional BGA transferring apparatus used to perform the above alignment.

In FIG. 5, CSP housing portions 51 are formed like a grid on an exclusive tray 50 at almost equal intervals. Moreover, a plurality of circuit boards (e.g. CSPs) 52 of a semiconductor package according to a BGA structure before solder balls are mounted are arranged on the respective CSP housing portions 51.

An attracting nozzle 53 vacuum-attracts and picks up the CSPs 52 on the exclusive tray 50 one by one and successively transfers them to a carrying tray 55 in which an adhesive layer is formed on the upside of an aluminum plate. In this case, the picked-up CSP 52 is photographed by a camera 54 to recognize the outline of the CSP 52 through image processing. Moreover, based on the recognition result, a plurality of CSPs 52 are arranged on CSP mounting portions 56 formed on the carrying tray 55 at almost equal intervals so that all the CSPs 52 turn to the same direction.

Thus, the carrying tray 55 is transferred to the solder ball transferring apparatus while the CSPs 52 are arranged at equal intervals to transfer solder balls to pads on each CSP 52. By making the array of a plurality of solder ball attracting nozzles of the solder ball transferring apparatus same as the array of a plurality of pads present on each CSP 52 arranged at equal intervals, it is possible to simultaneously mount solder balls on a plurality of CSPs 52.

As described above, conventionally, when transferring a plurality of CSPs 52, the CSPs 52 are arranged at equal intervals by recognizing the package shape (outline) of the CSPs 52. However, not all CSPs 52 are present so that pads are arranged at the same position on their package without being unevenly distributed. Therefore, even if arranging a plurality of CSPs 52 through outline recognition, the pads included in the CSPs 52 are not always arranged at correct positions and therefore, there is a problem that the accuracy of alignment of pads is bad.

For example, as shown in FIG. 6, when arranging three CSPs 52 in which a plurality of pads 57 are not arranged at the same position in accordance with outline recognition, the CSPs 52 are accurately arranged at equal intervals but the important pads 57 are not accurately arranged as a whole and the arrangement of the pads 57 does not coincide with the arrangement of solder ball attracting nozzles. Therefore, a mounting error may occur that solder balls cannot be accurately mounted on each pad.

SUMMARY OF THE INVENTION

The present invention is made to solve the above problem and its object is to make it possible to always accurately arrange pads included in each circuit board as a whole when arranging a plurality of circuit boards and to prevent a mounting error of a solder ball from occurring when simultaneously mounting solder balls on the circuit boards.

To solve the above problem, a circuit-board transferring apparatus of the present invention comprises a moving mechanism for vacuum-attracting and picking up a circuit board by an attracting nozzle and transferring the circuit board to a carrying tray on whose surface an adhesive layer is formed, an imaging unit for photographing the pad forming face of the circuit board picked up by the attracting nozzle, image processing means for processing the image photographed by the imaging unit and recognizing the arrangement of pads, and positioning means for deciding the transfer position of the circuit board on the carrying tray in accordance with a recognition result by the image processing means.

In another aspect of the present invention, the circuit board picked up by the attracting nozzle is mounted on a photographing table to photograph the pad forming face with the image processing means, then the position on the circuit board specified by the positioning means is vacuum-attracted by the attracting nozzle again, and thereby the circuit board picked up again at a correct position is transferred to a predetermined position on the carrying tray.

Moreover, a circuit board transferring method of the present invention comprises: a step of photographing the pad forming face of a circuit board to recognize pad arrangement through image processing when vacuum-attracting and picking up the circuit board by an attracting nozzle and transferring the circuit board to a carrying tray on whose surface an adhesive layer is formed; and a step of deciding the transfer position of the circuit board on the carrying tray in accordance with the recognition result of the pad arrangement.

Furthermore, a solder ball mounting method of the present invention comprises a step of vacuum-attracting and picking up a plurality of solder balls from a ball housing vessel by an attracting nozzle, a step of simultaneously transferring the picked-up solder balls to a plurality of pads formed on a plurality of circuit boards transferred to a carrying tray by the circuit-board transferring apparatus of claim 1, and a step of welding the solder balls transferred to the pads by applying a heat treatment to the solder balls transferred onto the pads.

Because the present invention is made by the above technical means, it is possible to make the positional relation between pads included in a plurality of circuit boards when arranged always accurately coincide with the positional relation between solder ball attracting nozzles of a solder ball mounting apparatus and to prevent a solder-ball mounting error even when simultaneously mounting solder balls on the circuit boards.

BRIEF DESCRIPTION OF THE DRAWINGS

FIGS. 4A to 4C are drawings to show processing steps of the solder ball mounting method by the present embodiment;

DETAILED DESCRIPTION OF THE PREFERRED EMBODIMENTS

Figure 1:
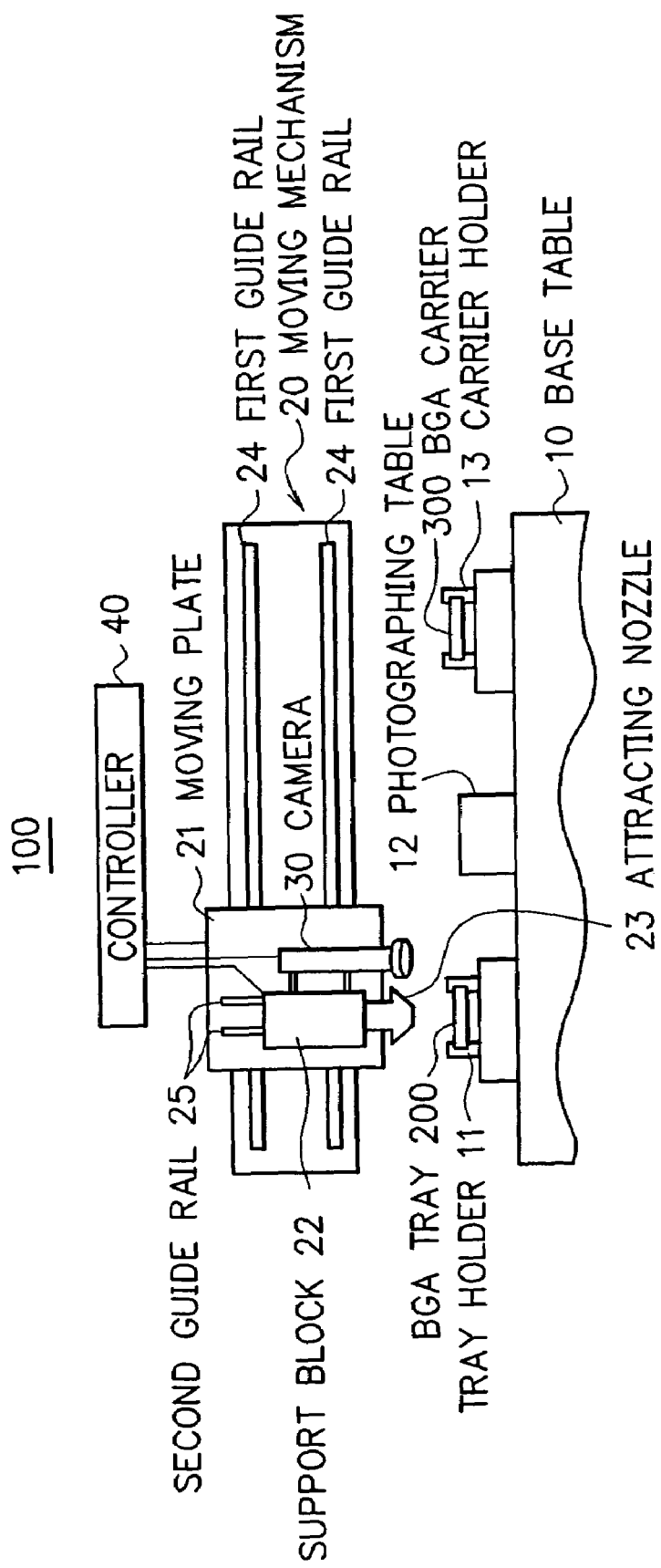
FIG. 1 is a drawing to show a schematic configuration of the circuit board transferring apparatus of the present embodiment.

An embodiment of the present invention is described below by referring to the accompanying drawings. FIG. 1 is a drawing to show a schematic configuration of the circuit board transferring apparatus of this embodiment. As shown in FIG. 1, the circuit board transferring apparatus 100 of this embodiment is constituted by including a base table 10, moving mechanism 20, camera 30, and controller 40.

A tray holder 11, photographing table 12, and carrier holder 13 are set on the base table 10. The tray holder 11 holds an exclusive tray 200 for mounting a plurality of circuit boards (such as CSPs) of a semiconductor package having a BGA structure before solder balls are mounted. CSP housing portions are formed on the BGA tray 200 like a grid at almost equal intervals and a plurality of CSPs are mounted on each CSP housing portion with the pad forming face directed upward.

The photographing table 12 is a table for photographing a pad forming face using the camera 30 by putting a CSP picked up from the BGA tray 200. The carrier holder 13 holds a BGA carrier 300. The BGA carrier 300 is a carrying tray for mounting a plurality of CSPs picked up from the BGA tray 200 and carrying them to a solder ball mounting apparatus (not shown) while a plurality of CSPs are arranged.

The moving mechanism 20 is moving means for picking up the CSPs mounted on the BGA tray 200 one by one and successively transferring them to the BGA carrier 300 held by the carrier holder 13, which is constituted by including a moving plate 21, support block 22, attracting nozzle 23, first guide rail 24, and second guide rail 25.

The moving plate 21 is constituted so as to be movable in the horizontal direction (X direction) along the first guide rail 24 and driven by a not-shown X-axis motor. The support block 22, attracting nozzle 23, and camera 30 are set to the moving plate 21 and they move in X direction in accordance with the movement of the moving plate 21.

The support block 22 supports the attracting nozzle 23 by its axis at its lower portion so as to be horizontally rotatable. Moreover, the camera 30 is integrally set to the support block 22. The support block 22 is constituted so as to be movable in the direction (Y direction) vertical to the paper surface of FIG. 1 and so as to be vertically movable (Z direction) along the second guide rail 25 and driven by not-illustrated Y-axis motor and Z-axis motor. The attracting nozzle 23 and camera 30 move in Y direction and Z direction in accordance with the movement of the support block 22.

The attracting nozzle 23 vacuum-attracts and picks up a CSP mounted on the BGA tray 200. As described above, the attracting nozzle 23 is constituted so as to be movable in X direction, Y direction, and Z direction in accordance with the movement of the moving plate 21 or support block 22 and so as to be horizontally rotatable. Horizontal rotation of the attracting nozzle 23 is performed by being driven by a not-shown rotating motor.

The camera 30 is an imaging unit for photographing the pad forming face of a CSP picked up from the BGA tray 200 by the attracting nozzle 23. Moreover, the controller 40 controls the whole of the moving mechanism 20 and has image processing means and positioning means of the present invention.

That is, the controller 40 processes the image of a CSP photographed by the camera 30 to recognize the arrangement of a plurality of pads formed on the CSP. Moreover, the controller 40 decides the transfer position of a CSP on the BGA carrier 300 in accordance with the recognition result. Furthermore, the controller 40 generates driving signals of the X-axis motor, Y-axis motor, Z-axis motor, and rotating motor in accordance with the decided positional information and supplies the signals to the motors respectively.

Figure 2:
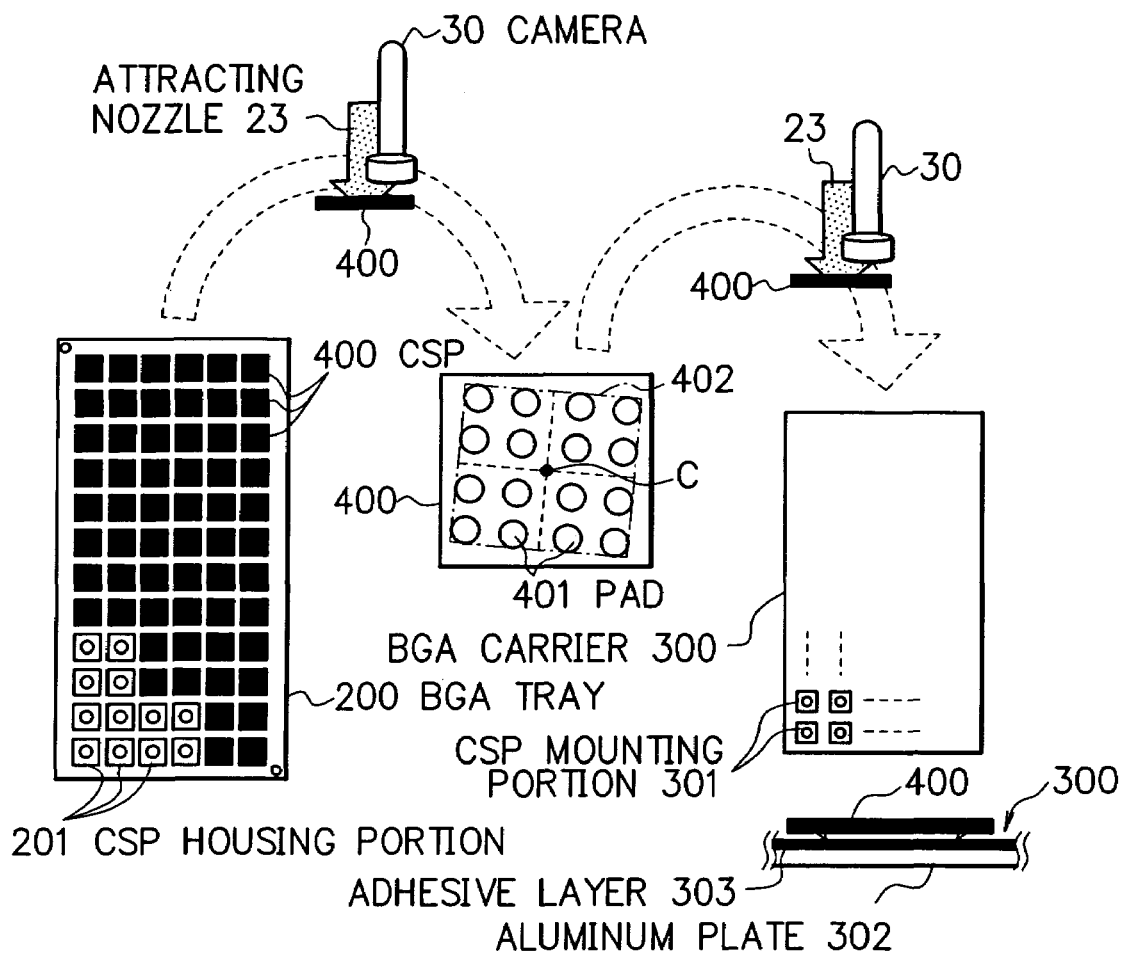
FIG. 2 is a drawing for explaining operations of the circuit board transferring apparatus of the present embodiment.

Then, operations of the circuit board transferring apparatus 100 having the above configuration will be described below. FIG. 2 is a drawing for explaining operations of the circuit board transferring apparatus 100. First, the attracting nozzle 23 moves to the upper portion of the BGA tray 200 and vacuum-attracts and picks up one of CSPs 400 mounted on CSP housing portions 201 of the BGA tray 200. At this stage, the attracting nozzle 23 moves to predetermined coordinates (approximate position on which each CSP 400 is mounted) to attract one of the CSPs 400.

Then, the apparatus 100 carries the held CSP 400 while attracted by the attracting nozzle 23 onto the photographing table 12 and temporarily mounts the picked-up CSP 400 on the photographing table 12 by canceling the vacuum attraction state of the attracting nozzle 23. Under this state, the apparatus 100 photographs the pad forming face of the CSP 400 by the camera 30.

As described above, the CSPs 400 are mounted on the BGA tray 200 with the pad forming faces directed upward and they are attracted from the upper portion by the attracting nozzle 23 and transferred to the photographing table 12. Therefore, the pad forming faces of the CSPs 40 are turned upward even on the photographing table 12. The camera 30 is integrally set with the support block 22 for holding the attracting nozzle 23 and present at the same side as the pad forming faces of the CSPs 400. Therefore, it is possible to photograph how a plurality of pads 401 are arranged on the CSPs 400.

Figure 5:
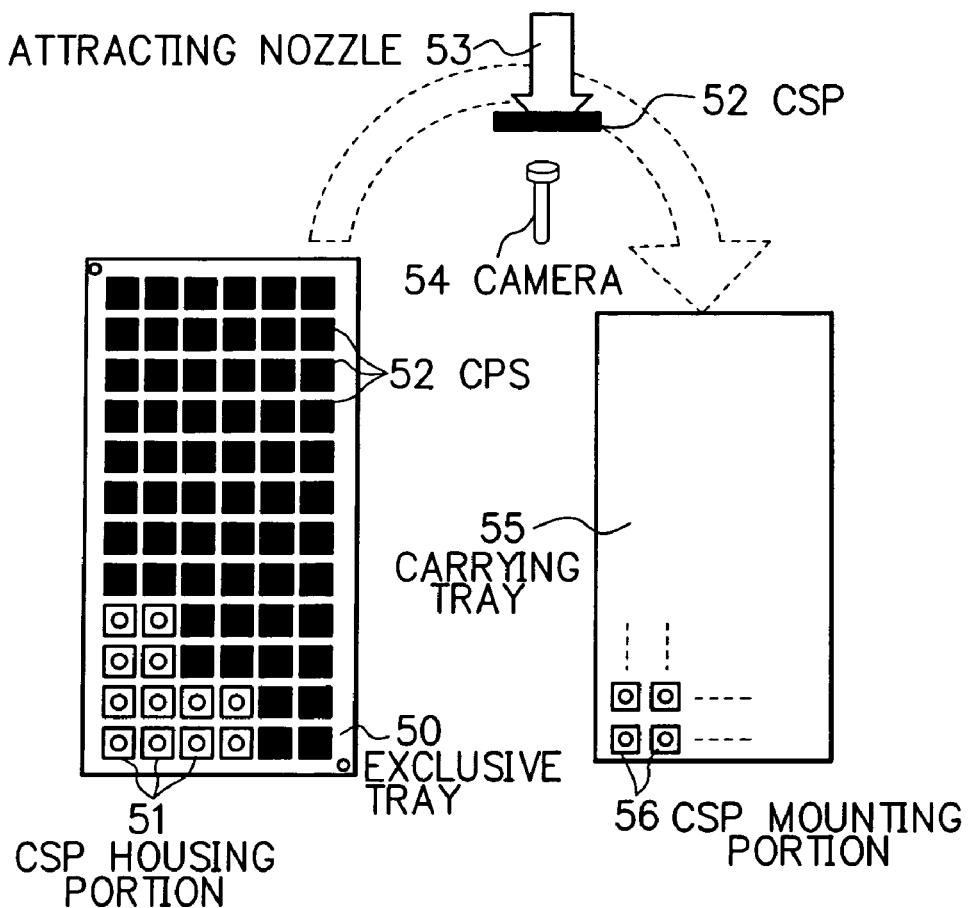
FIG. 5 is a drawing to show operations of a conventional circuit board transferring apparatus.
Figure 6:
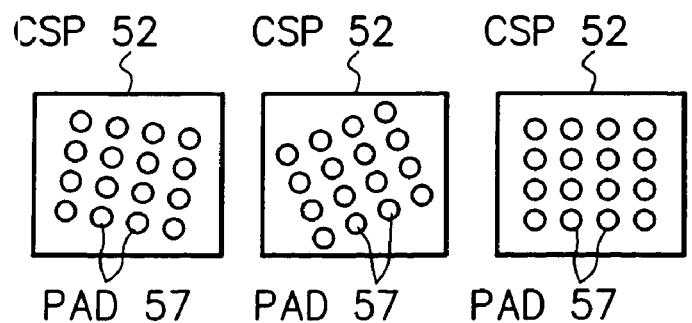
FIG. 6 is a drawing to show the arrangement state of a plurality of CSPs transferred to a BGA carrier in the prior art.

This is a point greatly different from the conventional BGA transferring apparatus shown in FIG. 5. That is, because the conventional BGA transferring apparatus performs photographing while attracting the CSP 52 by the attracting nozzle 53, the camera 54 is inevitably set to the side opposite to the attracting nozzle 53, that is, opposite to the pad forming face. Therefore, the CSP arrangement has been positioned so far on the basis of the outline of the CSP 52. However, this embodiment positions CSP arrangement on the basis of the arrangement of pads by photographing a pad forming face.

Specifically, the controller 40 processes images of the CSPs 400 photographed by the camera 30 to recognize the arrangement of a plurality of pads 401 formed on the CSPs 400. For example, the controller 40 recognizes edges (shown by an alternate long and short dash line 402 in FIG. 2) of the pads 401 arranged on the outermost circumference to specify an area (area in the alternate long and short dash line 402) in which a plurality of pads 401 are present in the CSP 400. Moreover, the controller 40 specifies the position of the central portion C of the area 402.

The controller 40 controls driving of the X-axis motor, Y-axis motor, Z-axis motor, and rotating motor in accordance with the positional information on the pad area 402 and its central portion C thus specified. Thereby, the attracting nozzle 23 vacuum-attracts the position of the central portion C specified by the controller 40 and picks up the CSPs 400 on the photographing table 12 again. In this case, by rotating the attracting nozzle 23 by an optional angle according to necessity, the arrangement state of a plurality of pads 401 is made to accurately coincide with the arrangement state of a plurality of solder ball attracting nozzles of a not-shown solder ball transferring apparatus.

Then, the attracting nozzle 23 moves up to the upper portion of the BGA carrier 300 while re-picking up the CSPs 400 at a correct positional relation coinciding with the arrangement state of the solder ball attracting nozzles. Moreover, by canceling the vacuum attraction state at a predetermined position on the BGA carrier 300 (position at which the central portion of the CSP mounting portions 301 formed like a grid at almost equal intervals coincides with the central portion C of the CSPs 400 specified by the controller 40), the attracting nozzle 23 mounts the picked-up CSPs 400 on the BGA carrier 300.

As shown in FIG. 2, the BGA carrier 300 is constituted by forming an adhesive layer 303 on an aluminum plate 303 and the mounted CSPs 400 are temporarily fixed by the adhesion of the adhesive layer 303. By repeatedly performing the above transferring operations of the CSPs 400 from the BGA tray 200 to the BGA carrier 300 one by one, the CSPs 400 are mounted on the BGA carrier 300 in an arranged state.

Figure 3:
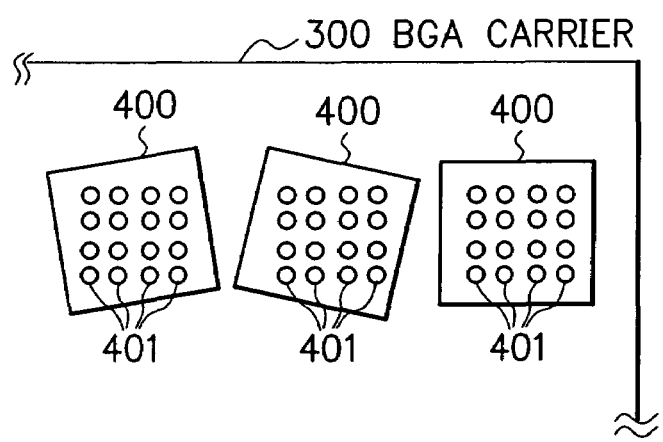
FIG. 3 is a drawing to show the arrangement state of a plurality of CSPs transferred to a BGA carrier in the present embodiment.

FIG. 3 is a drawing to show the arrangement state of a plurality of CSPs 400 transferred to the BGA carrier 300. As shown in FIG. 3, according to this embodiment, even if a plurality of pads 401 are formed in any state in the CSPs 400 to be transferred, while these CSPs 400 are transferred to the BGA carrier 300, all the pads 401 included in the CSPs 400 are accurately arranged as a whole so that the arrangement of the CSPs 400 always coincides with the arrangement of solder ball attracting nozzles.

FIGS. 4A to 4C are drawings to show a step of mounting solder balls on the pads 401 of the CSPs 400 transferred to the BGA carrier 300 as described above. First, as shown in FIG. 4A, a solder ball 43 housed in a ball housing vessel 41 is picked up with vacuum-attraction by an attracting pad 42. Though not shown in detail in FIGS. 4A to 4C, the attracting pad 42 has a plurality of attracting nozzles and each attracting nozzle attracts one solder ball. The arrangement of the attracting nozzles coincides with the arrangement of a plurality of pads 401 included in the CSPs 400 shown in FIG. 3.

Then, as shown in FIG. 4B, an adhesive flux 44 is applied to the pads formed on the CSPs 400 transferred to the BGA carrier 300 by the circuit board transferring apparatus 100 of this embodiment. Moreover, as shown in FIG. 4C, a plurality of solder balls 43 picked up by the attracting pad 42 are simultaneously transferred to the pads coated with the flux 44.

In the case of the example in FIG. 4C, a plurality of solder balls 43 are simultaneously transferred by one operation every the total of four CSPs 400 such as vertically 2 and horizontally 2 CSPs 400, as indicated by reference numeral 305. Thereafter, mounting of the solder balls 43 is completed by applying a heat treatment (reflow) to the solder balls 43 temporarily fixed by the adhesion of the flux 44 applied to the pads and welding the solder balls 43 to the pads.

As described above in detail, according to this embodiment, pad forming faces of the CSPs 400 are photographed to recognize the arrangement of pads through image processing and CSPs 400 are positioned in accordance with the recognition result of the pad arrangement. Therefore, even if the pads are formed in any arrangement state in the CSPs 400 to be transferred, it is possible to make the positional relation between a plurality of pads included in the CSPs 400 always accurately coincide with the positional relation between a plurality of solder ball attracting nozzles.

Thereby, it is possible to simultaneously mount solder balls on a plurality of CSPs 400 and in this case, it is possible to prevent a solder ball mounting error from occurring.

For the above embodiment, an example has been described in which when picking up the CSPs 400 from the photographing table 12, they are attracted at a correct position specified by the controller 40 and transferred to the predetermined position of the BGA carrier 300 in accordance with their attracted state. However, the present invention is not restricted to the above example. For example, it is also allowed to attract the CSPs 400 at a proper position when picking up the CSPs 400 from the photographing table 12, and mount the CSPs 400 on a correct position specified by the controller 40 when transferring them to the BGA carrier 300.

Moreover, for the above embodiment, an example has been described in which solder balls are simultaneously mounted on four CSPs 400. However, the number four is only an example. By using the circuit board transferring apparatus 100 of this embodiment, it is possible to accurately position the CSPs 400. Therefore, it is possible to simultaneously mount solder balls on an optional number of CSPs 400 in a range allowed by the capacity of the solder ball mounting apparatus. Reversely saying, by using the circuit board transferring apparatus 100 of this embodiment, it is possible to give a full play of the simultaneous mounting capacity of the solder ball mounting apparatus.

Moreover, for the above embodiment, a configuration has been described in which the camera 30 is integrally set to the support block 22 to move the camera 30 together with the support block 22. However, it is also allowed to fix the camera 30 above the photographing table 12.

Furthermore, for the above embodiment, an example is described in which CSPs 400 are mounted on the photographing table 12 while turning pad forming faces upward and photographed from a position above the pad forming faces. However, a configuration is not restricted to the above case. For example, it is allowed to set a holder constituted so as to hold only the circumferential portion of the CSPs 400 instead of the photographing table 12 and hold the CSPs 400 by the holder while turning pad forming faces downward and then photograph the pad forming faces by a camera set below the holder. In short, any configuration can be used as long as the configuration allows pad forming faces to be photographed.

Furthermore, for the above embodiment, an example has been described in which edges of a plurality of pads 401 present on the CSPs 400 and the central portion C are recognized through image processing. However, this is only an example. For example, positions of pads at four corners or the position of a pad on one opposite angle may be detected to recognize the arrangement state of pads in accordance with the position information. Moreover, it is allowed to transfer the CSPs 400 to a predetermined position on the BGA carrier 300 on the basis of an optional point or a plurality of points other than the central portion C.

The above embodiment shows only an embodied example to execute the present invention but the present invention must not be definitely construed by the example. That is, it is possible to execute the present invention in various forms without departing from the spirit or main feature of the present invention.

INDUSTRIAL APPLICABILITY

The present invention is useful to make it possible to make the positional relation between pads included in a plurality of BGAs when arranging the BGAs to simultaneously mount solder balls on the BGAs always accurately coincide with the positional relation between solder ball attracting nozzles. Moreover, the present invention is also useful when simultaneously mounting solder balls on a semiconductor package other than a BGA, other semiconductor component, or substrate or simultaneously applying a flux or cream solder.

What is claimed is:

1. A circuit board transferring apparatus comprising:
a moving mechanism for vacuum-attracting the pad forming face of a circuit board and picking up the circuit board by an attracting nozzle and transferring the circuit board to a carrying tray on whose surface an adhesive layer is formed;
an imaging unit for photographing the pad forming face of the circuit board picked up by the attracting nozzle;
image processing means for processing the image photographed by the imaging unit and recognizing the arrangement of pads; and
positioning means for deciding a transfer position of the circuit board on the carrying tray in accordance with a recognition result by the image processing means,
wherein the attracting nozzle mounts and releases the circuit board in an upward facing position on a photographing table to image the pad forming face with the image processing means, and
wherein, after the image processing means images the pad forming face, the attracting nozzle picks up the circuit board from the photographing table in a specified position by the positioning means and transfers the circuit board to a predetermined position on the carrying tray while maintaining the pad forming face in the upward facing position.

2. A circuit board transferring method, comprising:
picking up the circuit board with an attracting nozzle located on a pad-forming face of the circuit board;
releasing the circuit board from the attracting nozzle and mounting the circuit board on a photographing table such that the pad-forming face of the circuit board is mounted in an upward facing position;
photographing the pad forming face of the circuit board to recognize a pad arrangement through image processing;
deciding a transfer position of the circuit board on a carrying tray in accordance with the recognition result of the pad arrangement; and
transferring the circuit board to the carrying tray on whose surface an adhesive layer is formed while maintaining the pad-forming face of the circuit board in the upward facing position.

3. A solder ball mounting method comprising using the circuit board transferring apparatus of claim 1, the method comprising:
vacuum-attracting and picking up a plurality of solder balls from a ball housing vessel using the attracting nozzle;
simultaneously transferring the picked-up solder balls to a plurality of pads formed on respective pad forming faces of a plurality of circuit boards transferred to the carrying tray; and
applying a heat treatment to the plurality of solder balls transferred onto the pads.

* * * * *